(12) United States Patent
Ingalls et al.

(10) Patent No.: US 11,500,435 B2
(45) Date of Patent: Nov. 15, 2022

(54) INFORMATION HANDLING SYSTEM HAVING REGIONAL COOLING

(71) Applicant: DELL PRODUCTS, L.P., Round Rock, TX (US)

(72) Inventors: Andrew O. Ingalls, Round Rock, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 134 days.

(21) Appl. No.: 16/836,018

(22) Filed: Mar. 31, 2020

(65) Prior Publication Data

US 2020/0225720 A1 Jul. 16, 2020

Related U.S. Application Data

(62) Division of application No. 15/206,924, filed on Jul. 11, 2016, now Pat. No. 10,705,579.

(51) Int. Cl.
| | |
|---|---|
| *H05K 7/20* | (2006.01) |
| *G06F 1/20* | (2006.01) |
| *F24F 11/76* | (2018.01) |
| *G05D 23/19* | (2006.01) |

(52) U.S. Cl.
CPC ............ *G06F 1/206* (2013.01); *F24F 11/76* (2018.01); *G05D 23/1934* (2013.01); *H05K 7/20145* (2013.01); *H05K 7/20727* (2013.01); *H05K 7/20736* (2013.01); *H05K 7/20836* (2013.01)

(58) Field of Classification Search
CPC ...... F24F 11/76; G05D 23/1934; G06F 1/206; H05K 7/20145; H05K 7/20727; H05K 7/20736; H05K 7/20836
See application file for complete search history.

(56) References Cited

U.S. PATENT DOCUMENTS

| | | | |
|---|---|---|---|
| 4,289,272 A | 9/1981 | Murase et al. | |
| 4,934,397 A | 6/1990 | Niemelä et al. | |
| 8,820,101 B2 * | 9/2014 | Hausmann | F25D 23/003 62/181 |
| 8,862,278 B2 | 10/2014 | Lin et al. | |
| 8,949,647 B2 | 2/2015 | Nastacio | |
| 2004/0044693 A1 * | 3/2004 | Hadley | G06F 8/71 |
| 2004/0177132 A1 * | 9/2004 | Zhang | G06F 9/4411 709/220 |
| 2005/0092012 A1 * | 5/2005 | Hirano | A47F 3/0404 62/298 |
| 2005/0174737 A1 * | 8/2005 | Meir | G06F 1/206 361/697 |
| 2010/0138056 A1 * | 6/2010 | Holmes | G06F 1/3203 700/282 |
| 2010/0170273 A1 * | 7/2010 | Morimoto | B01D 53/265 62/176.6 |
| 2013/0158713 A1 | 6/2013 | Geissler et al. | |

(Continued)

*Primary Examiner* — Jonathan Bradford
(74) *Attorney, Agent, or Firm* — Larson Newman, LLP

(57) ABSTRACT

Custom cooling strategies may be implemented for different regions in computers, servers, and other information handling systems. Chassis architecture may have multiple cooling fans, with each fan cooling a different region via dedicated duct work. A user or administrator may thus implement different cooling strategies for internal components, based on different thermal curves defined for each different region.

17 Claims, 16 Drawing Sheets

(56) References Cited

U.S. PATENT DOCUMENTS

| | | |
|---|---|---|
| 2013/0254563 A1 | 9/2013 | Culbert et al. |
| 2013/0258574 A1 | 10/2013 | Pamley et al. |
| 2014/0208785 A1* | 7/2014 | Wallace ............. F25B 49/02 62/115 |
| 2014/0257591 A1 | 9/2014 | Cheng et al. |
| 2015/0198957 A1* | 7/2015 | Montero ............. G06F 1/20 700/300 |
| 2015/0338281 A1 | 11/2015 | Ross et al. |
| 2016/0066068 A1 | 3/2016 | Schultz et al. |

* cited by examiner

INFORMATION HANDLING SYSTEM HAVING REGIONAL COOLING

CROSS-REFERENCE TO RELATED APPLICATION

This application is a continuation of U.S. patent application Ser. No. 15/206,924 entitled "Information Handling System Having Regional Cooling," filed on Jul. 11, 2016, the disclosure of which is hereby expressly incorporated by reference in its entirety.

FIELD OF THE DISCLOSURE

The present disclosure generally relates to information handling systems, and more particularly relates to regional cooling of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

Custom cooling strategies may be implemented for different regions in computers, servers, and other information handling systems. Chassis architecture may have multiple cooling fans, with each fan cooling a different region via dedicated duct work. A user or administrator may thus implement different cooling strategies for internal components, based on different thermal curves defined for each different region.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
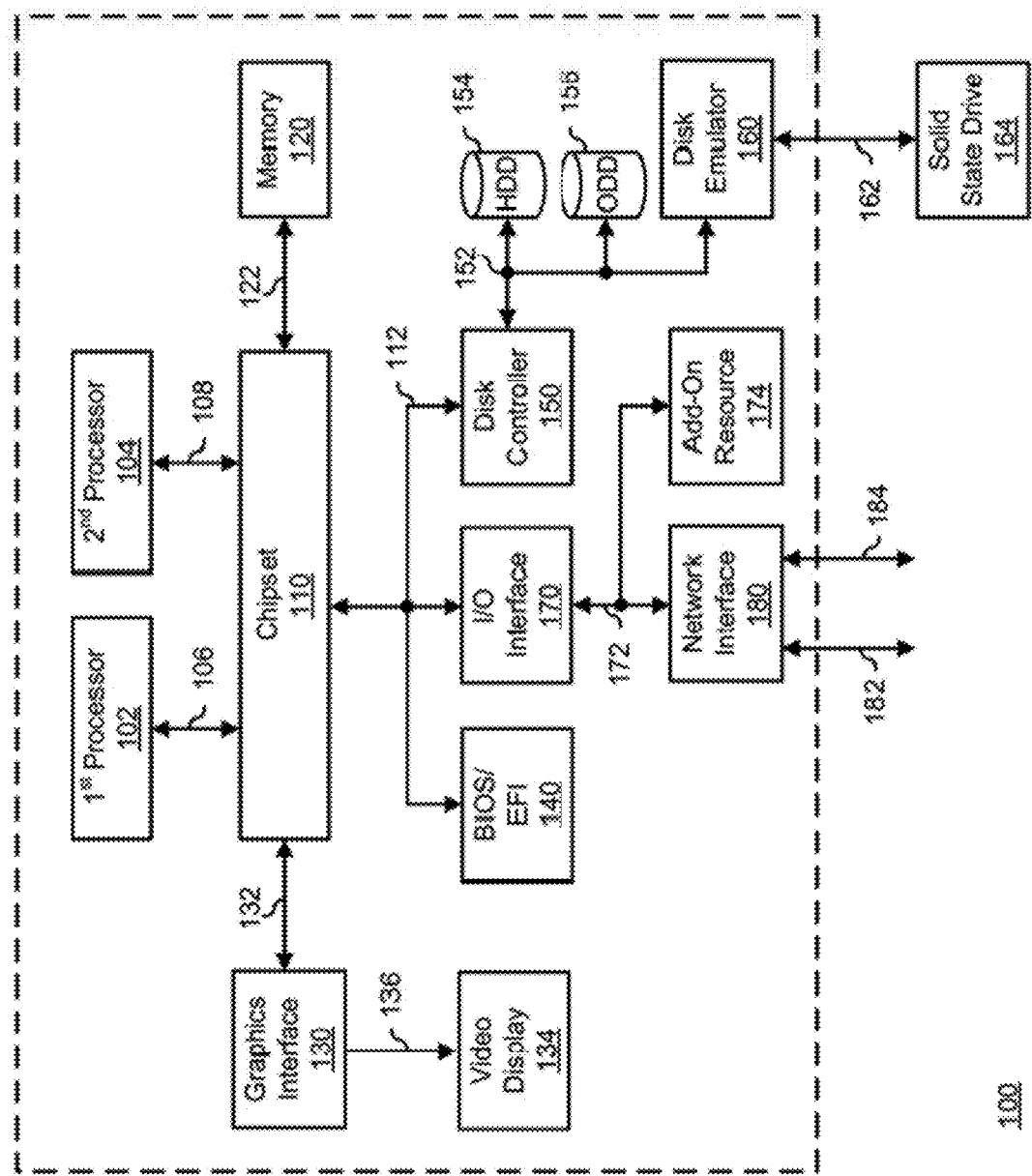
FIG. 1 is a block diagram illustrating an information handling system according to an embodiment of the present disclosure.

FIG. 1 illustrates a generalized embodiment of information handling system 100, according to exemplary embodiments. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniB and channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
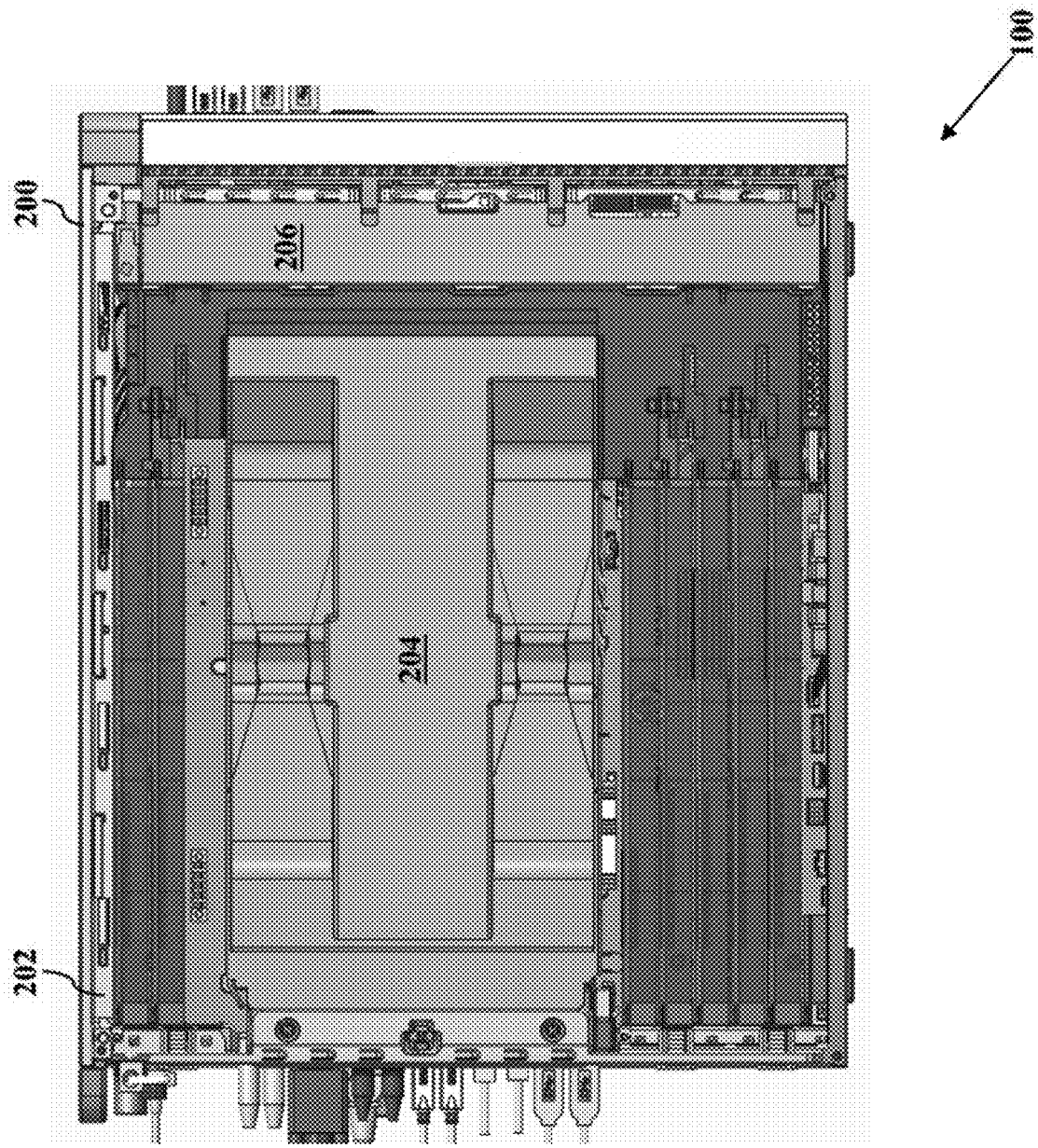
FIGS. 2-3 are cross-sectional views of the information handling system, according to exemplary embodiments.
Figure 3:
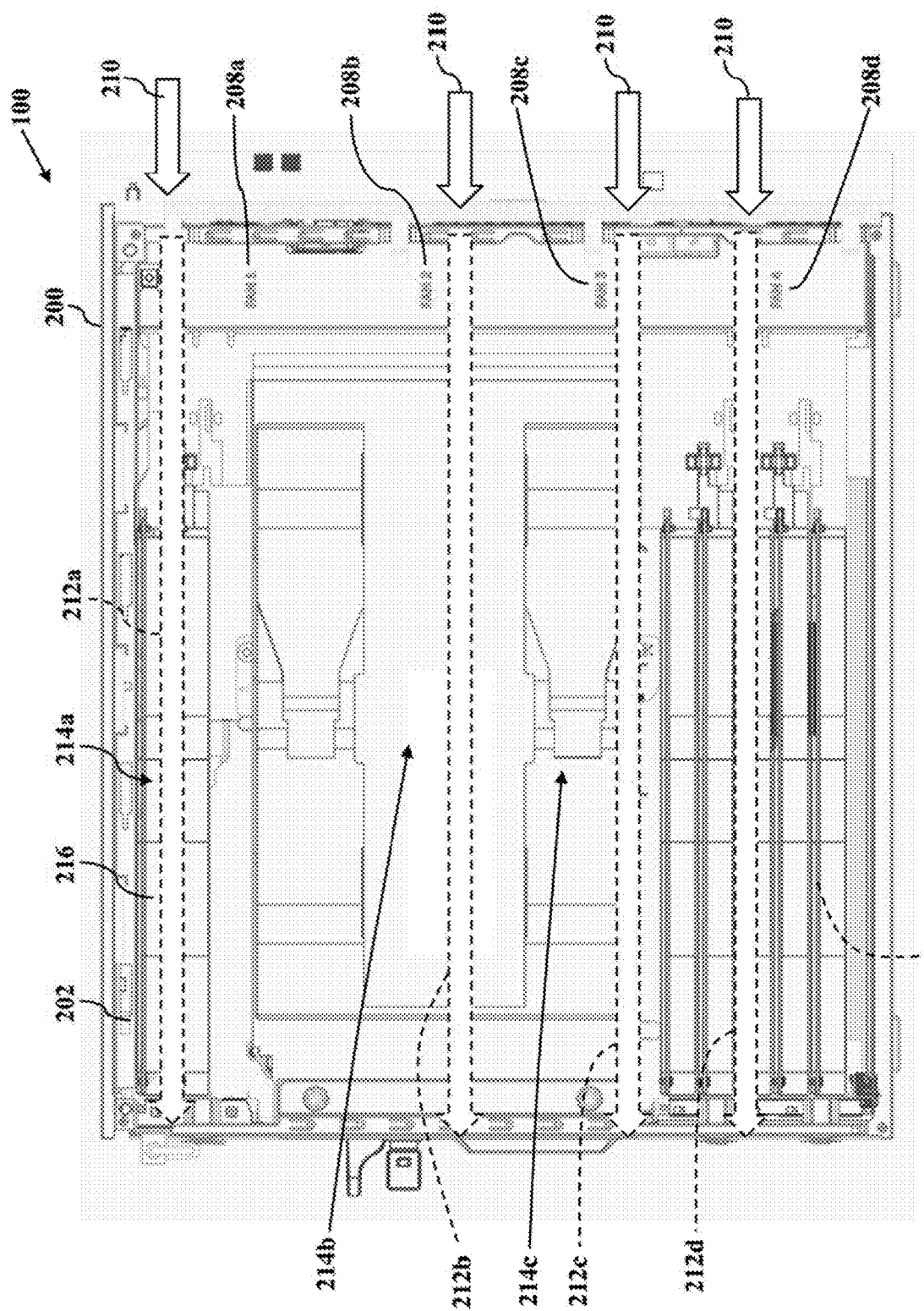

FIGS. 2-3 show the information handling system 100 with an outer panel or cover has been removed to reveal internal componentry. The information handling system 100 has an outer enclosure or cabinet 200 that houses the internal componentry mounted to a chassis 202. As FIG. 2 illustrates, one or more removable shrouds (such as 204 and 206) may obscure some of the internal componentry (such as the processors 102 and 104 and the memory 120, as illustrated in FIG. 1). These shrouds 204 and 206 may also function as regional cooling systems. For example, in FIG. 3 the shroud 206 (illustrated in FIG. 2) has been removed to reveal a bank of one or more cooling fans 208. Each one of the cooling fans 208 draws ambient air 210 from outside the cabinet 200. As the reader may understand, when the internal componentry receives electrical power and/or operates, the internal componentry generates waste heat. Each cooling fan 208 thus pushes the ambient air 210 across the internal componentry for a convective cooling effect.

FIG. 3 thus illustrates active regional cooling. Each cooling fan 208 has a dedicated channel or duct 212 that flows the ambient air 210 into and/or across the regional componentry. A first fan 208a, for example, may be independently controlled to move the ambient air 210 along a first duct 212a to cool a first region 214a within the chassis 202 that houses various peripheral cards 216. A second fan 208b may be independently controlled to move the ambient air 210 along a second duct 212b to cool a second region 214b (perhaps housing the processors 102 and 104 illustrated in FIG. 1). A third fan 208c may be independently controlled to move the ambient air 210 along a third duct 212c to cool a third region 214c (perhaps housing the memory 120 illustrated in FIG. 1). A fourth fan 208d may be independently controlled to move the ambient air 210 along a fourth duct 212d to cool a fourth region 214d (perhaps housing still more componentry, such as a power supply and/or additional peripheral cards 216). Each different cooling fan 208a-d is thus in fluid flow communication via the respective duct 212a-d with its dedicated region 214a-d. Each fan 208a-d thus forces the ambient air 210 along or through its dedicated duct 212a-d to circulate and to convectively cool the corresponding componentry. While FIG. 3 illustrates the four (4) different regions 214a-d, exemplary embodiments may be applied to more or less cooling fans that are dedicated to more or less regions.

Figure 4:
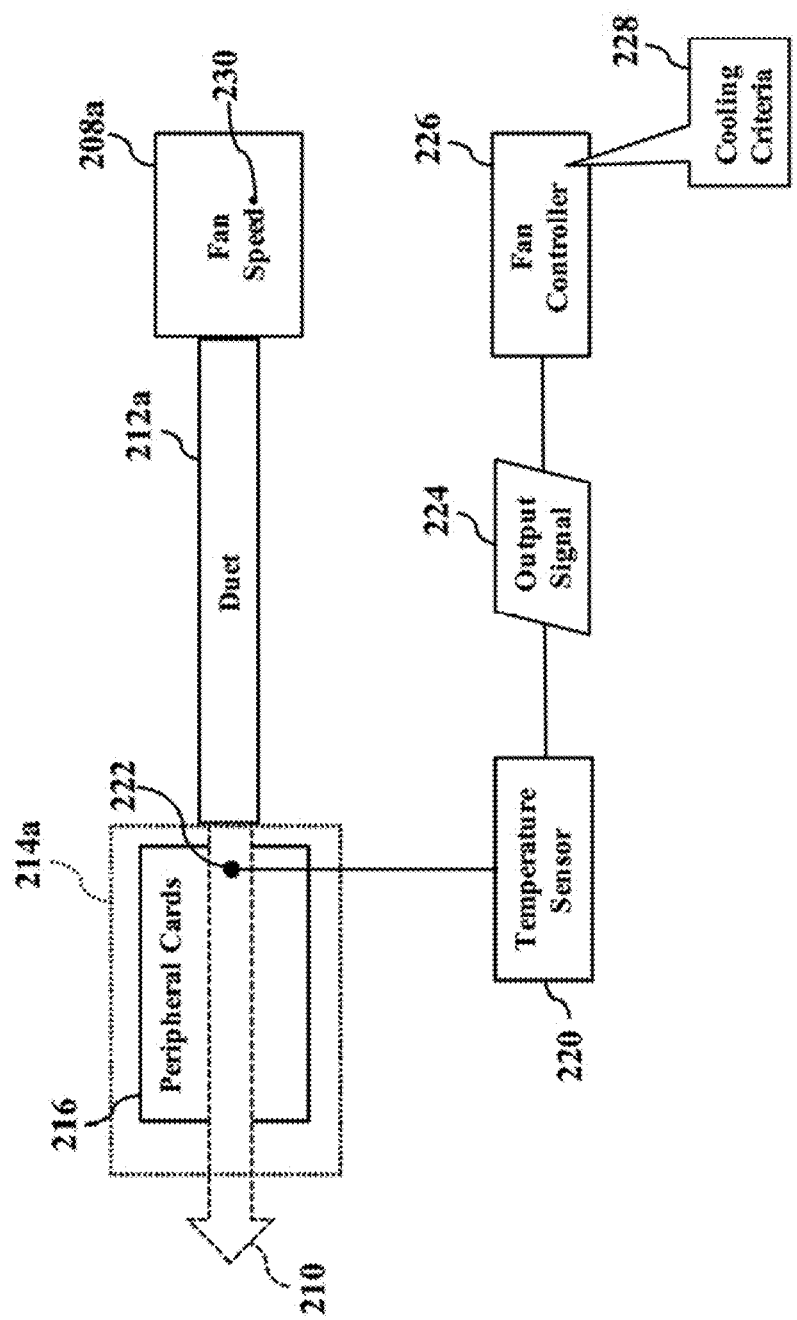
FIG. 4 is a block diagram illustrating regional temperature measurement, according to exemplary embodiments.

FIG. 4 shows a temperature sensor 220 that may be positioned within each region 214 to monitor a regional temperature 222. FIG. 4, for example, illustrates the temperature sensor 220 mounted or placed in proximity to the peripheral cards 216 installed or mounted within the first region 214a. As the first fan 208a pushes the ambient air 210 into the first region 214a, the temperature sensor 220 generates an output signal 224. The output signal 224 may then be processed or conditioned (such as analog-to-digital conversion), received, and analyzed by a fan controller 226. The fan controller 226 inspects or compares the output signal 224 to various cooling criteria 228, which will be later explained. The fan controller 226 then instructs the fan 208a to vary its rotational speed 230 to satisfy the cooling criteria 228. While FIG. 4 only illustrates the temperature sensor 220 monitoring the first region 214a, the reader may now understand that each other region (illustrated as reference numerals 214b-d in FIG. 3) may have a corresponding temperature sensor (such as 220b-d) and different cooling criteria (such as 228b-d, depending on the componentry being cooled.

Exemplary embodiments may utilize any sensing technology and location. The temperature sensor 220 may be a thermistor, thermocouple, transistor, transducer, or any other means for generating an electrical signal in response to a temperature (or temperature difference). Moreover, regardless of the sensor technology, the temperature sensor 220 may be positioned or operate at any location within the chassis 200 that best reflects a particular regional temperature.

Figure 5:
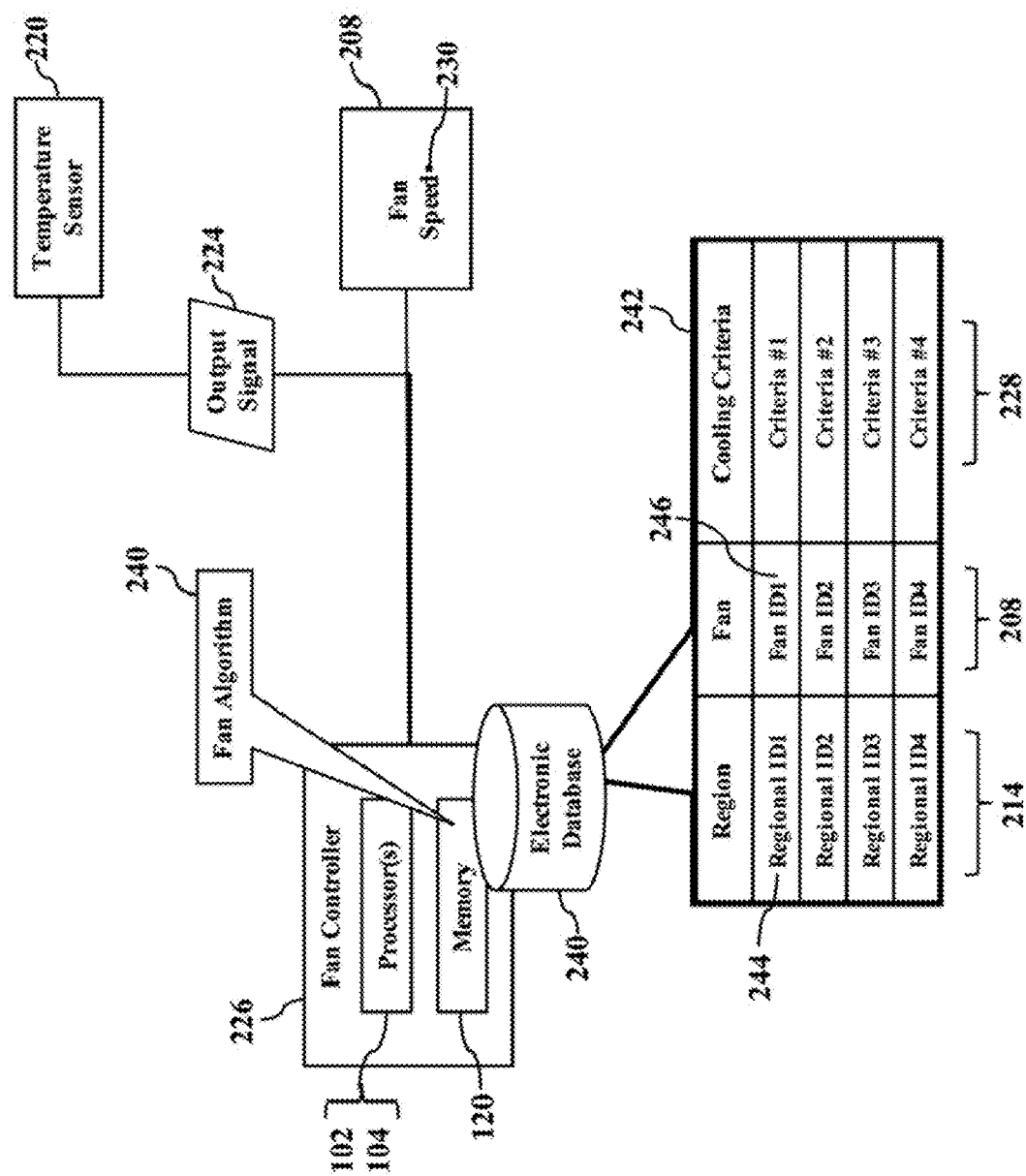
FIGS. 5-7 illustrate regional cooling, according to exemplary embodiments.
Figure 6:
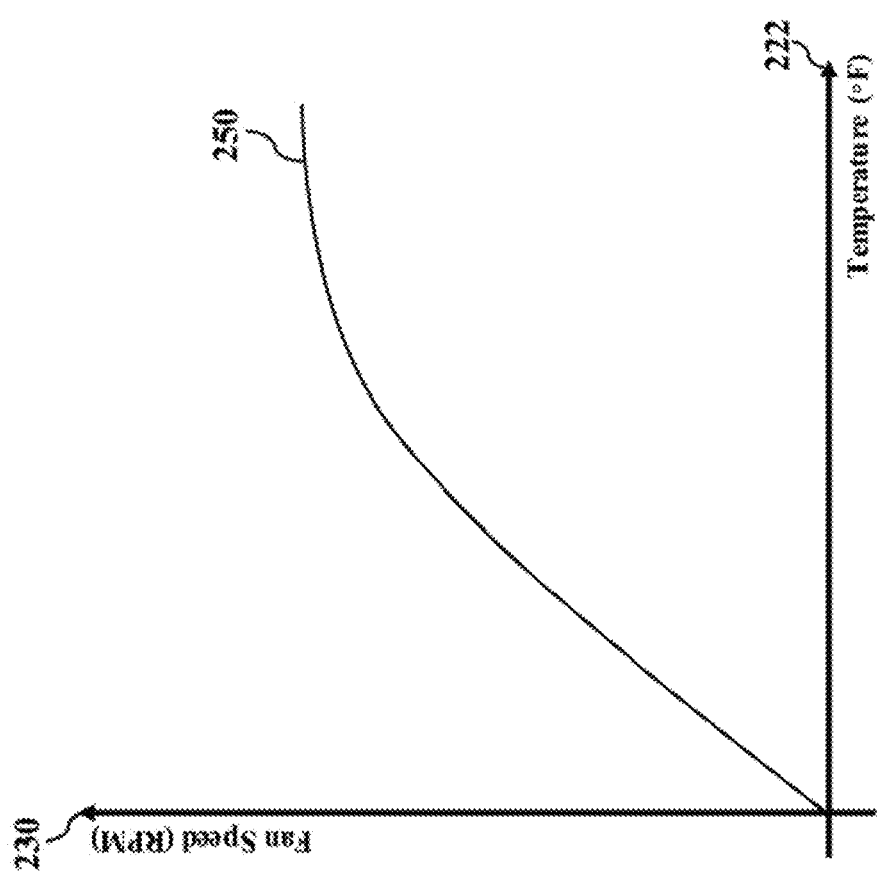
Figure 7:
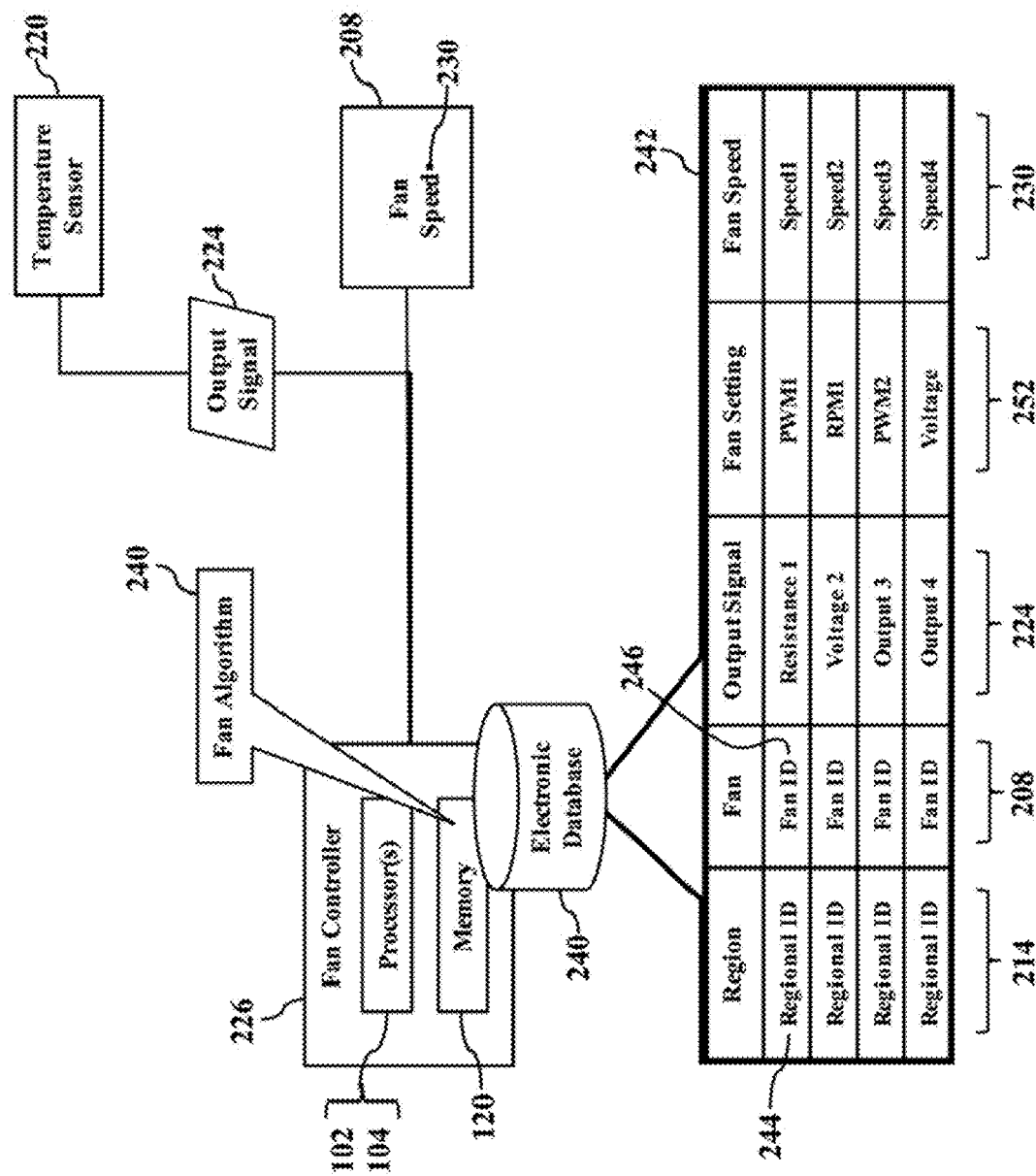
Figure 8:
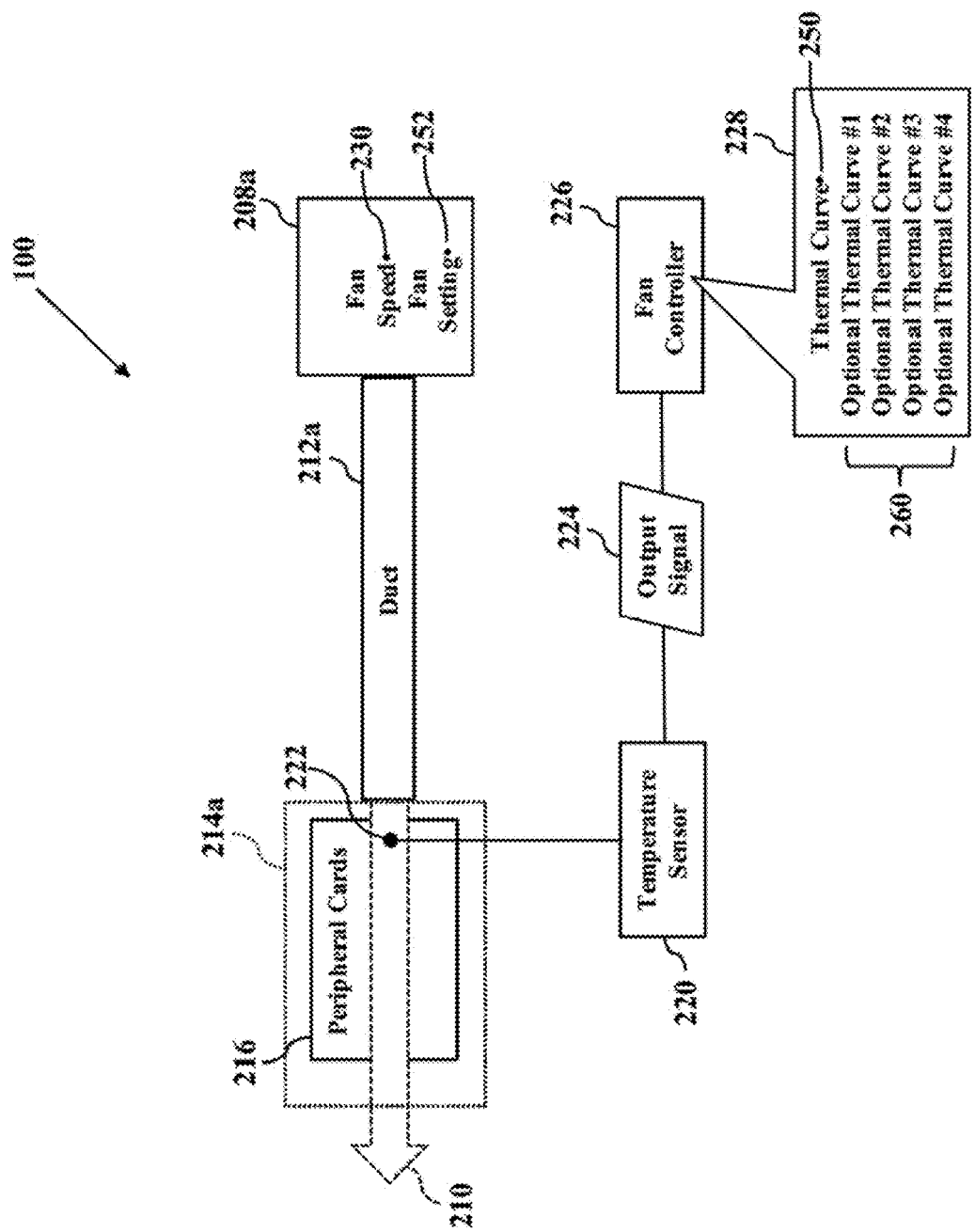
FIGS. 8-11 illustrate user variation, according to exemplary embodiments.

FIGS. 5-7 show that when the fan controller 226 receives the output signal 224 generated by the temperature sensor 220, the fan controller 226 commands the corresponding fan 208 to operate and/or spin, according to the cooling criteria 228. The fan controller 226, for example, may be a fan algorithm 240 that is stored in the memory 120 and executed by either or both of the processors 102 and 104. The fan algorithm 240 may thus instruct the processors 102 and/or 104 to query an electronic database 240 to retrieve the cooling criteria 228 associated with the corresponding region 214 served by the fan 208. While the electronic database 240 may have any physical or electronic construction, for simplicity FIG. 5 illustrates the electronic database 240 as a table 242 that maps, relates, or associates the different regions 214 and/or the different fans 208 to their corresponding cooling criteria 228. For example, the electronic database 240 may have entries that associate a regional identifier 244 and/or a fan identifier 246 to the corresponding cooling criteria 228. While FIG. 5 only illustrates a few entries in the table 242, in practice the electronic database 240 may have many entries for many different configurations. Exemplary embodiments may thus perform a database lookup and retrieve the cooling criteria 228 having an electronic association with the region 214 and/or the fan 208.

FIGS. 6-7 show how the cooling criteria 228 generally define the operation of the cooling fan 208 in response to the regional temperature (such as the output signal 224) determined by the temperature sensor 220 (as FIG. 4 best illustrates). FIG. 6, for example, is a simple illustration of a thermal curve 250 that specifies fan speed 230 according to the regional temperature 222. As the reader may understand, the fan 208 may be commanded to spin faster at higher temperatures. FIG. 7 thus illustrates tabular fan settings 252 according to the different output signals 224 generated by the temperature sensor 220. In simple words, as the temperature 222 changes, the corresponding output signal 224 may be mapped or associated to a corresponding fan setting 252. While exemplary embodiments may use any means of fan control, FIG. 7 illustrates some simple examples. The electronic database 240, for example, may have entries that associate different output signals 224 (perhaps generated by the temperature sensor 220) to values associated with pulse width modulation (or "PWM"), rotational speed (or "RPM"), or voltage. The fan controller 226 may thus select the fan setting 252 that is electronically associated with the output signals 224 generated by the temperature sensor 220. The fan controller 226 retrieves the corresponding fan setting 252 and causes the fan 208 to operate or to rotate at a corresponding speed 230.

FIGS. 8-11 illustrate user variation, according to exemplary embodiments. Here a user of the information handling system 100 may manually vary the operation of the fan 208. Suppose again that the first fan 208a cools the first region 214a housing the peripheral cards 216. Sometimes the user may install one or more third party or aftermarket peripheral cards 216 that operate "hotter" than original equipment. That is, the user removes one or more peripheral cards 216 that were initially installed by a manufacturer. The user may thus install higher performance or differently designed peripheral cards that generate excessive heat. Sometimes these modifications require additional cooling capabilities above or greater than the cooling criteria 228 (such as the thermal curve 250).

Figure 9:
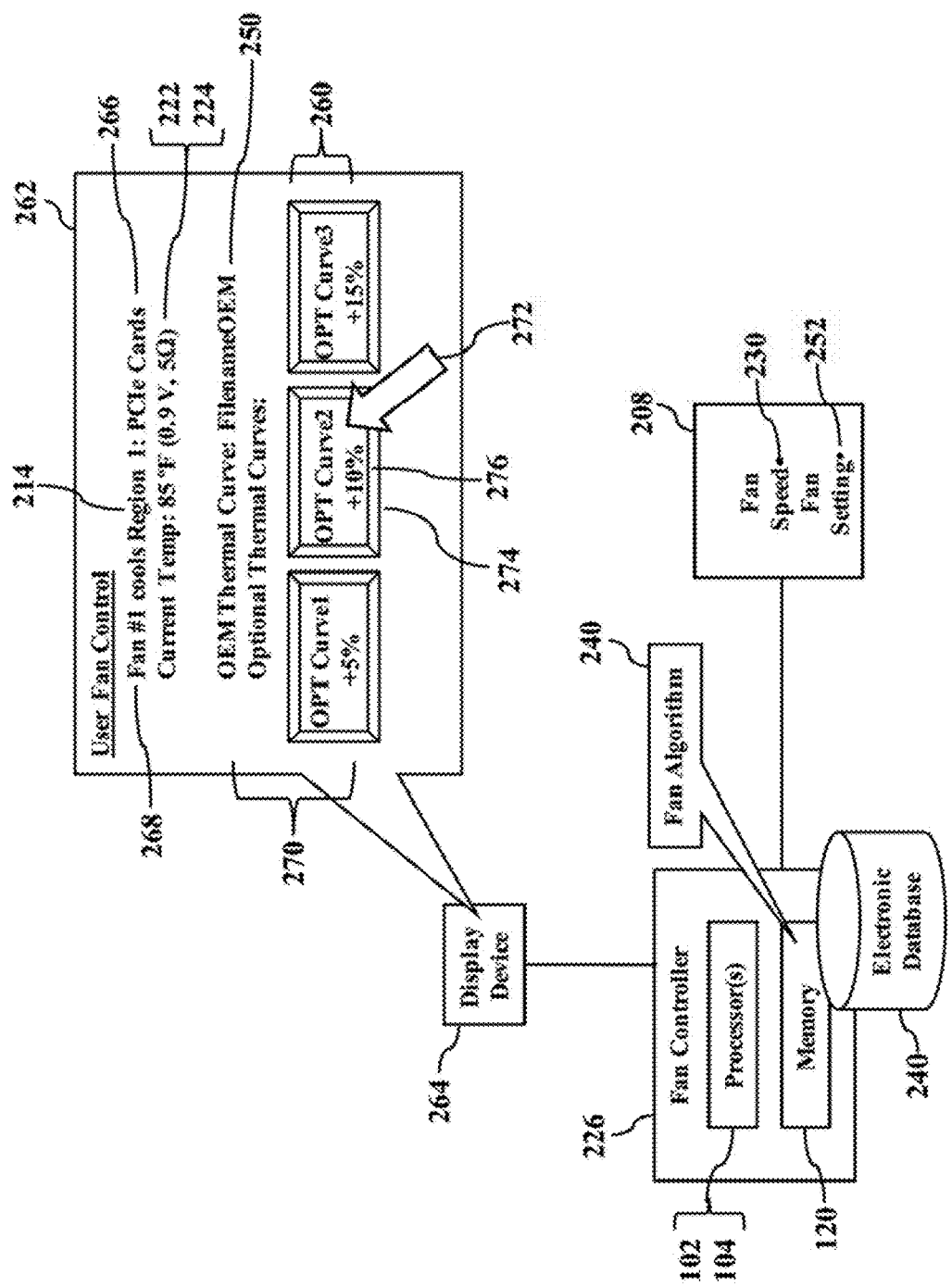

Exemplary embodiments thus include one or more optional thermal curves 260. Whenever the user desires additional cooling output from the fan 208, the user may select any of the optional thermal curves 260. The optional thermal curves 260 may specify greater or higher fan settings 252 for the same output signals 224 generated by the temperature sensor 220. Thus, the optional thermal curves 260 may cause the fan 208 to spin faster for any regional temperature 222 (as inferred from the output signal 224). As FIG. 9 illustrates, exemplary embodiments may include a graphical user interface 262 for controlling operation of the fan 208. The graphical user interface 262 is generated for display by a display device 264 (such as a monitor or capacitive touch screen) or as a webpage for download from a webserver. Regardless, the graphical user interface 262 may display data or information indicating any of the regions 214, a description 266 of the componentry housed within the region 214, the corresponding regional temperature 222 (perhaps inferred from the output signal 224), and a description 268 of the fan 208 cooling that region 214.

The graphical user interface 262 may also display a menu 240 of thermal curves. The graphical user interface 262, for example, may include data or information indicating the manufacturer's installed thermal curve 250 (illustrated as an Original Equipment Manufacturer or (OEM)). The graphical user interface 262 may also include information describing the available optional thermal curves 260. The OEM thermal curve 250 is thus initially installed by the manufacturer and specifies the initial cooling capability of the fan 208. However, whenever the user desired additional cooling capability, the user may select one of the optional thermal curves 260. The user, for example, may place a graphical cursor 272 or other control and tactilely select a graphical control 274 that corresponds to the desired one of the optional thermal curves 260. The graphical user interface 262 may even display some measure of enhanced cooling performance 276 (such as a percentage increase in fan speed 230 and/or the fan setting 252) to aid the user in her selection. Once the user's selection is input and received, the fan algorithm 240 may thus cause the fan controller 226 to query the electronic database 240 and implement the corresponding optional thermal curve 260 that specifies greater or higher fan settings 252.

Figure 10:
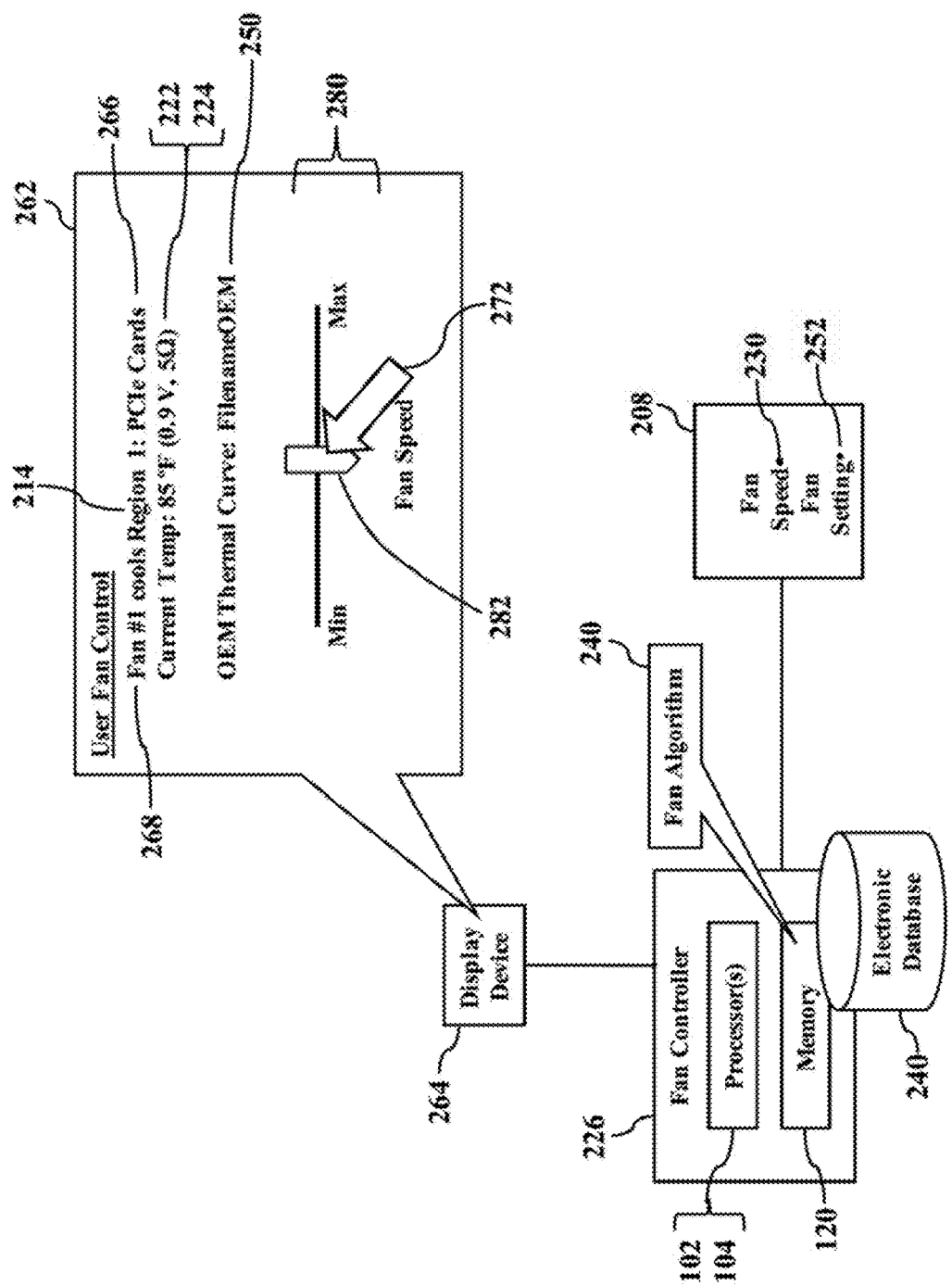
Figure 11:
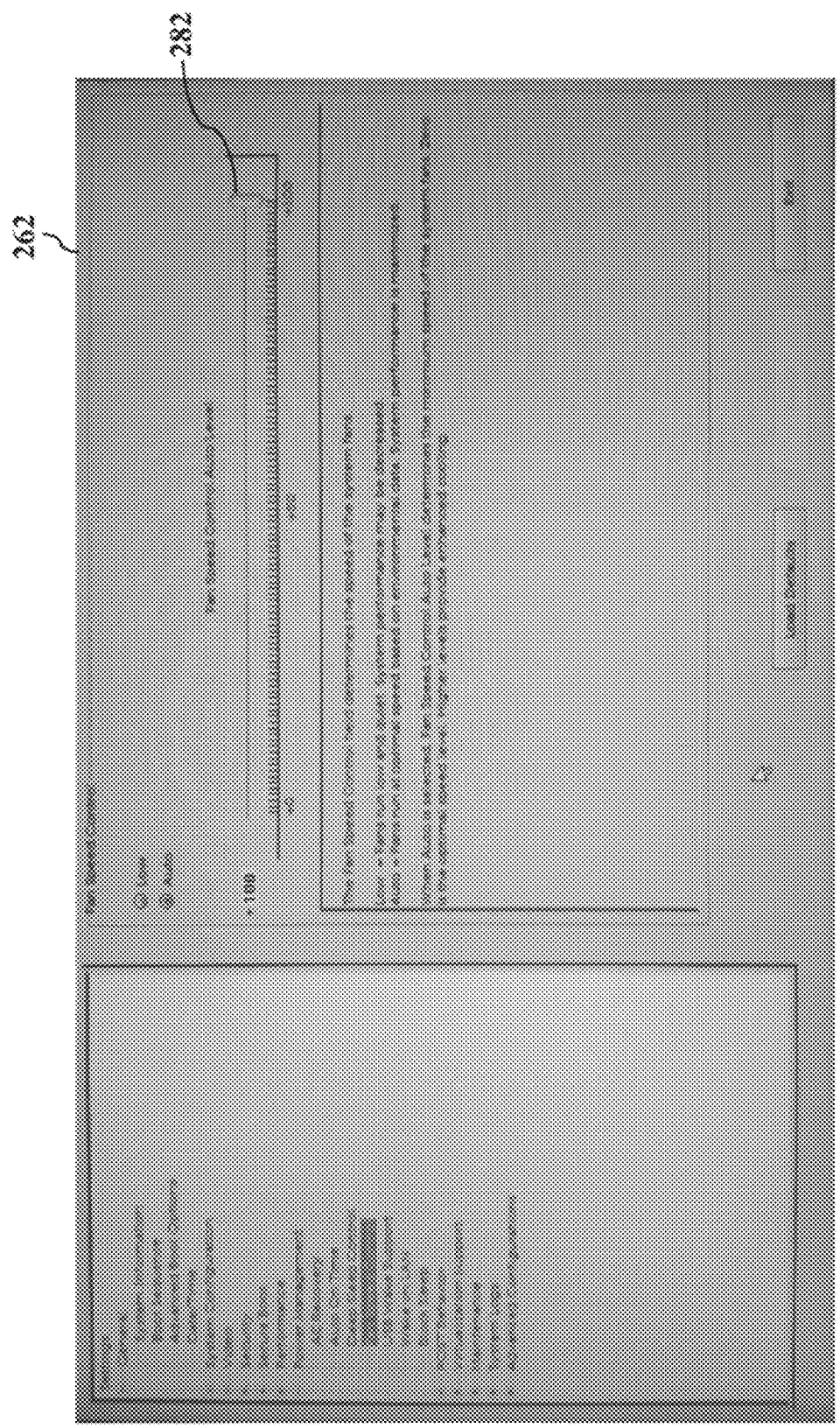

FIGS. 10-11 illustrate manual fan control. Here the graphical user interface 262 may display a graphical speed control 280 for modifying or changing the fan speed 230. FIGS. 10-11 illustrate the graphical speed control 280 as a slider 282 that varies the fan setting 252 in response to a graphical position of the slider 282. The user may thus move the slider 282 (perhaps by dragging the graphical cursor 272) to choose the desired fan speed 230. The fan algorithm 240 may thus cause the fan controller 226 to implement the corresponding fan setting 252 that is predetermined for the position of the slider 282. The graphical user interface 262 may even simultaneously display the regional temperature 222 (as determined by the output signal 224 generated by the temperature sensor 220), thus allowing the user to visually see the cooling effect of moving the slider 282.

Figure 12:
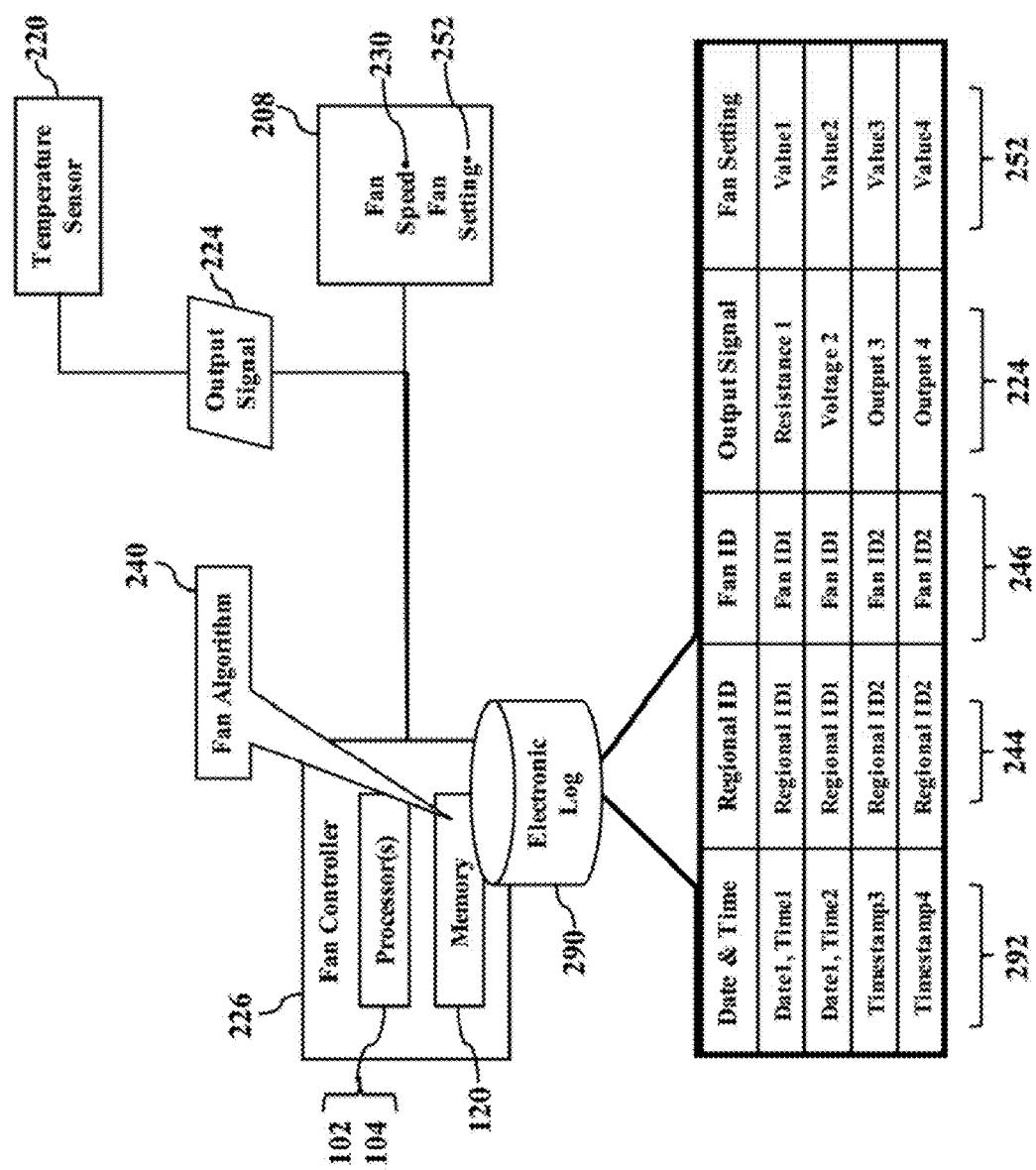
FIG. 12 illustrates logging of regional cooling, according to exemplary embodiments.

FIG. 12 illustrates logging of regional cooling, according to exemplary embodiments. Here exemplary embodiments may log the operation of the fan 208 for analysis and action. As FIG. 12 illustrates, the fan algorithm 240 may cause the fan controller 226 to generate and store an electronic log 290 having entries that periodically and/or randomly record or track the output signals 224 (generated by the regional temperature sensor 220) to the corresponding fan setting 252 and to a current date and time 292. The electronic log 290 may also log the corresponding regional identifier 244 and fan identifier 246. Over time, then, the electronic log 290 reveals current and historical entries that detail the cooling effects of the fan 208.

Figure 13:
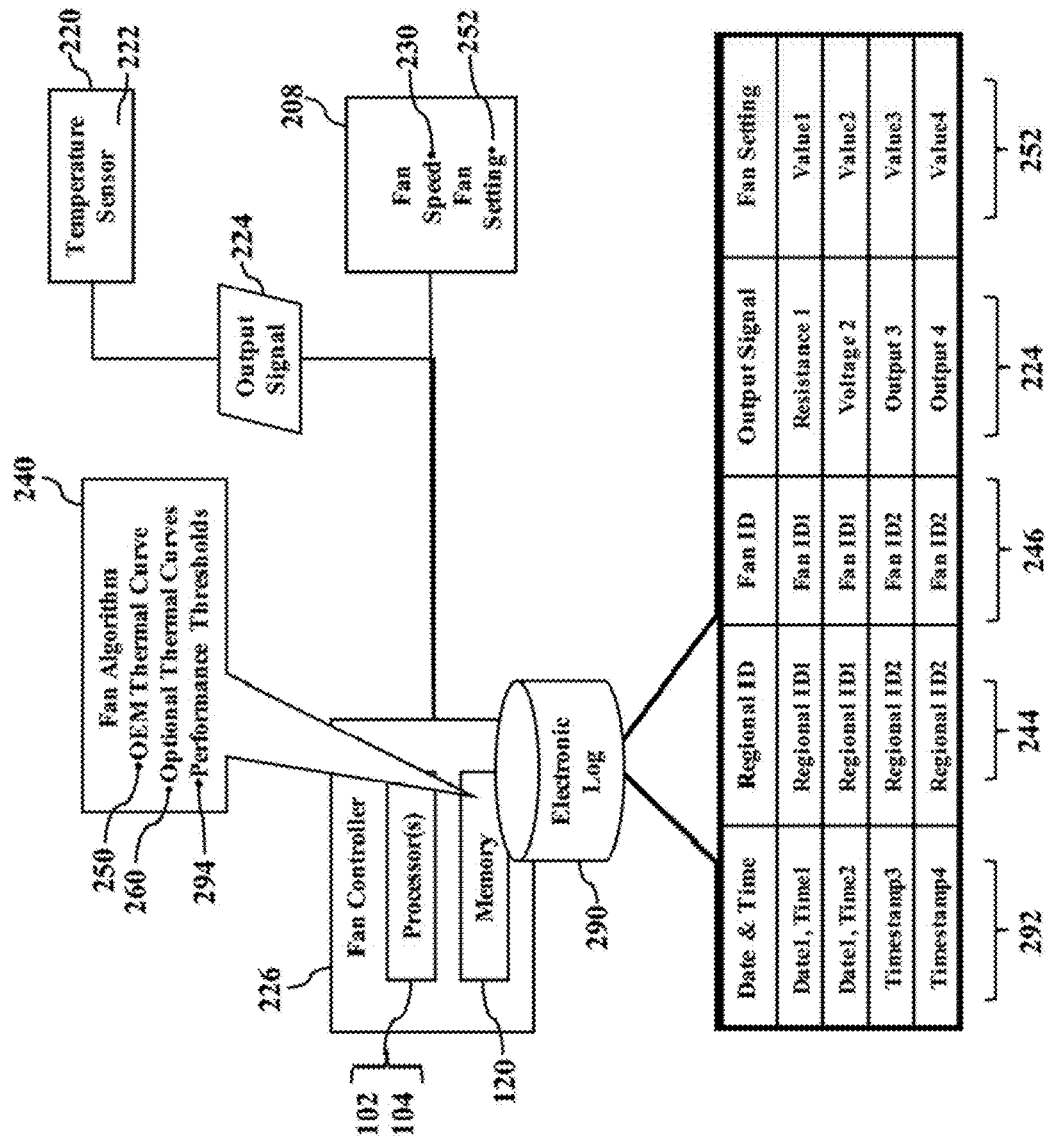
FIG. 13 illustrates automatic fan control, according to exemplary embodiments.

FIG. 13 illustrates automatic fan control, according to exemplary embodiments. Here exemplary embodiments may switch to any of the optional thermal curves 260, based on the entries in the electronic log 290. As the entries are logged, the fan algorithm 240 may cause the fan controller 226 to monitor any of the entries for abnormal operation. Suppose the fan controller 226 compares one or more of the entries in the electronic log 290 to performance thresholds 294 that define normal or abnormal operation. A signal threshold, for example, may specify a value of the output signal 224 (generated by the regional temperature sensor 220) at which a high or even unacceptable regional temperature 222 is inferred or determined. A momentary or short spike in the regional temperature 222 may be tolerable, but prolonged high temperatures may likely damage the internal componentry. The performance thresholds 294 may thus also specify or define an interval of time during which excessive temperatures (as determined by the output signals 224) are tolerated. Excessive temperatures logged longer than the interval of time may be flagged or reported as abnormal.

Exemplary embodiments may thus automatically select an optional thermal curve 260. As the entries are logged, the fan algorithm 240 may cause the fan controller 226 to compare the entries to the performance threshold(s) 294. Should any single entry or series of entries indicate abnormal operation, the fan algorithm 240 may automatically select one of the optional thermal curves 260. The fan controller 226 may thus automatically delete and/or replace the OEM thermal curve 250 with any one of the available optional thermal curves 260. The fan controller 226 thus operates and controls the corresponding fan 208 according to the selected one of the optional thermal curves 260.

Logging may continue. The fan controller 226 may continue logging entries in the electronic log 290, even after the fan controller 226 automatically switched to one of the optional thermal curves 260. Exemplary embodiments, in other words, may continue recursively logging entries and comparing to the performance thresholds 294. If the entries still indicate abnormal operation, the fan algorithm 240 may again automatically select another one of the optional thermal curves 260 and accordingly modify the cooling effects of the fan 208. The fan algorithm 240 may thus sequentially, numerically, alphabetically, randomly, or otherwise progress through the different optional thermal curves 260 until normal operation (perhaps as determined by the performance thresholds 294) is momentarily or consistently achieved.

Figure 14:
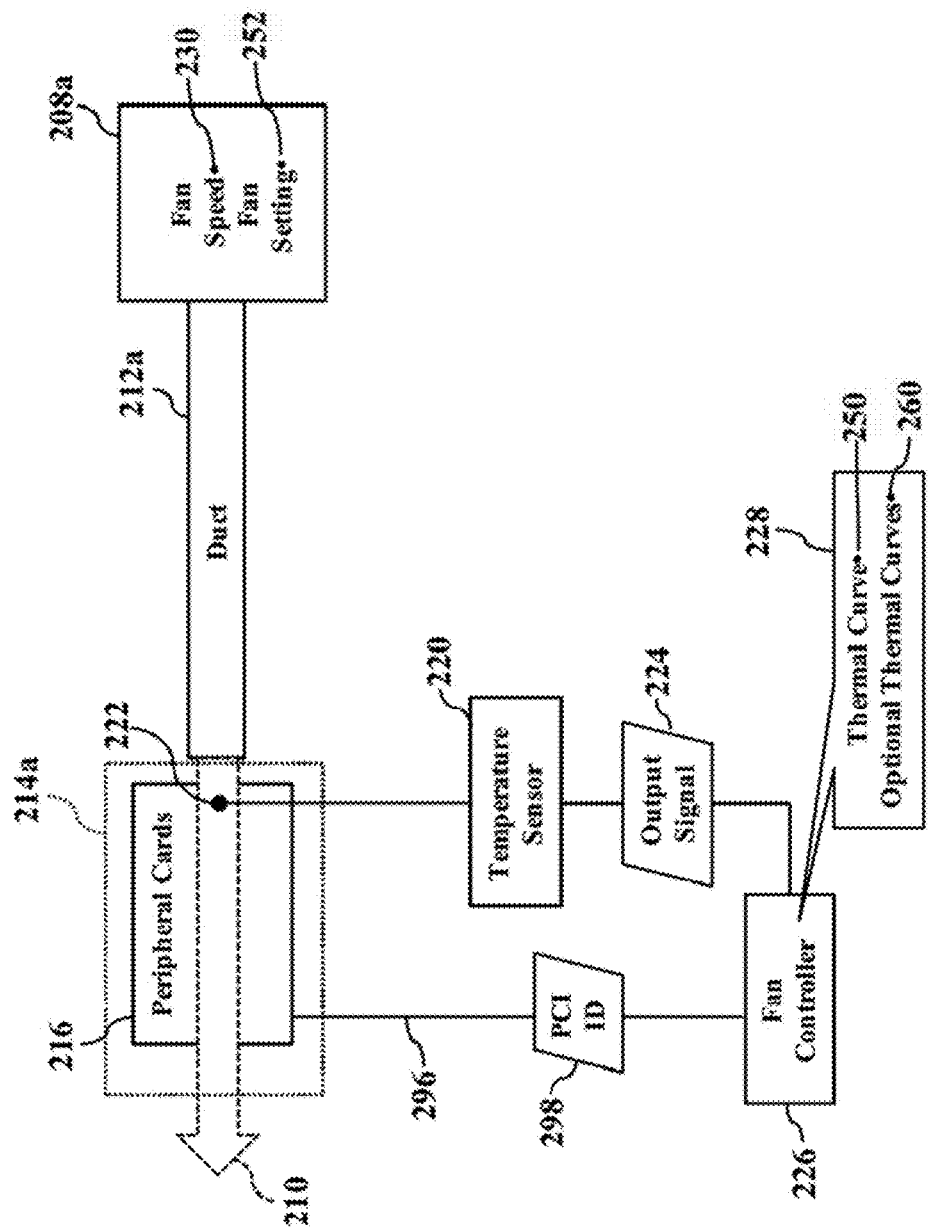
FIGS. 14-16 further illustrate automatic fan control, according to exemplary embodiments.
Figure 15:
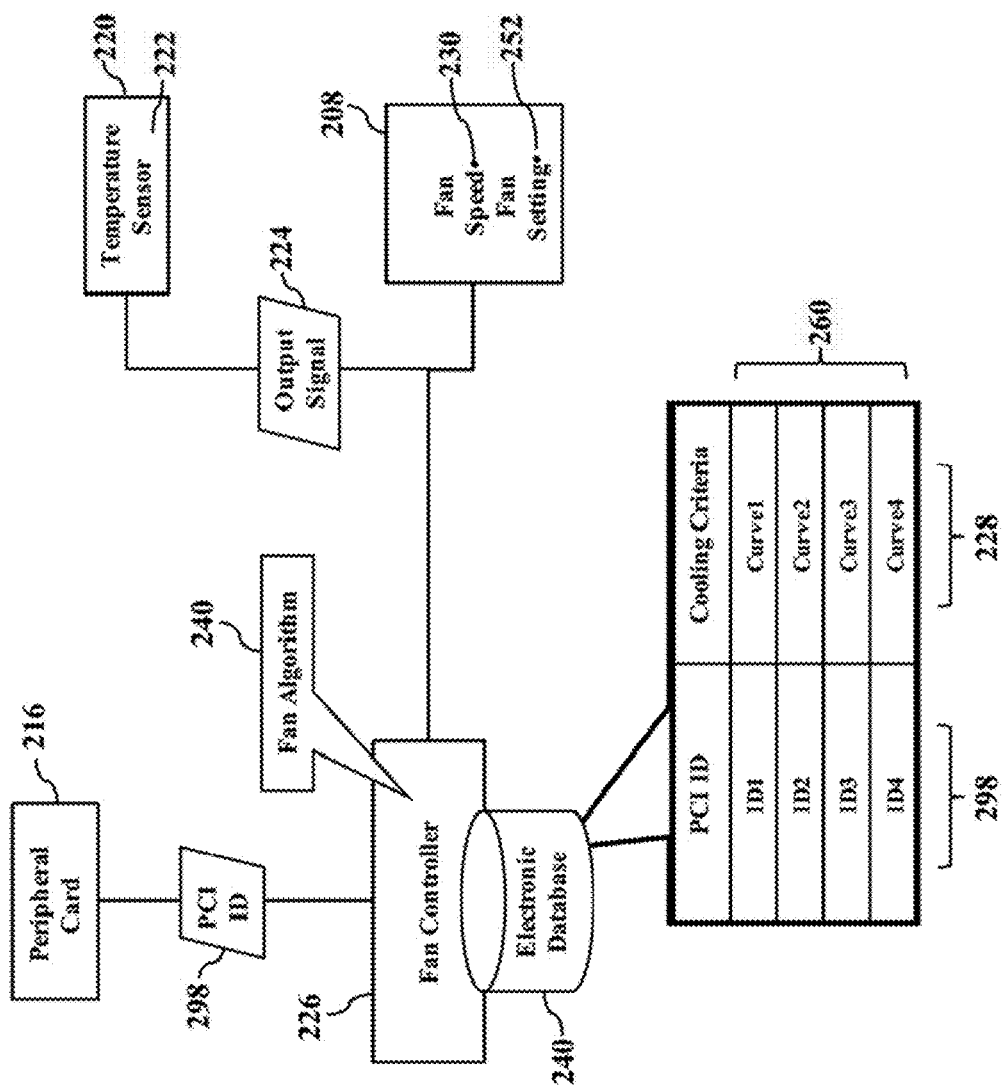
Figure 16:
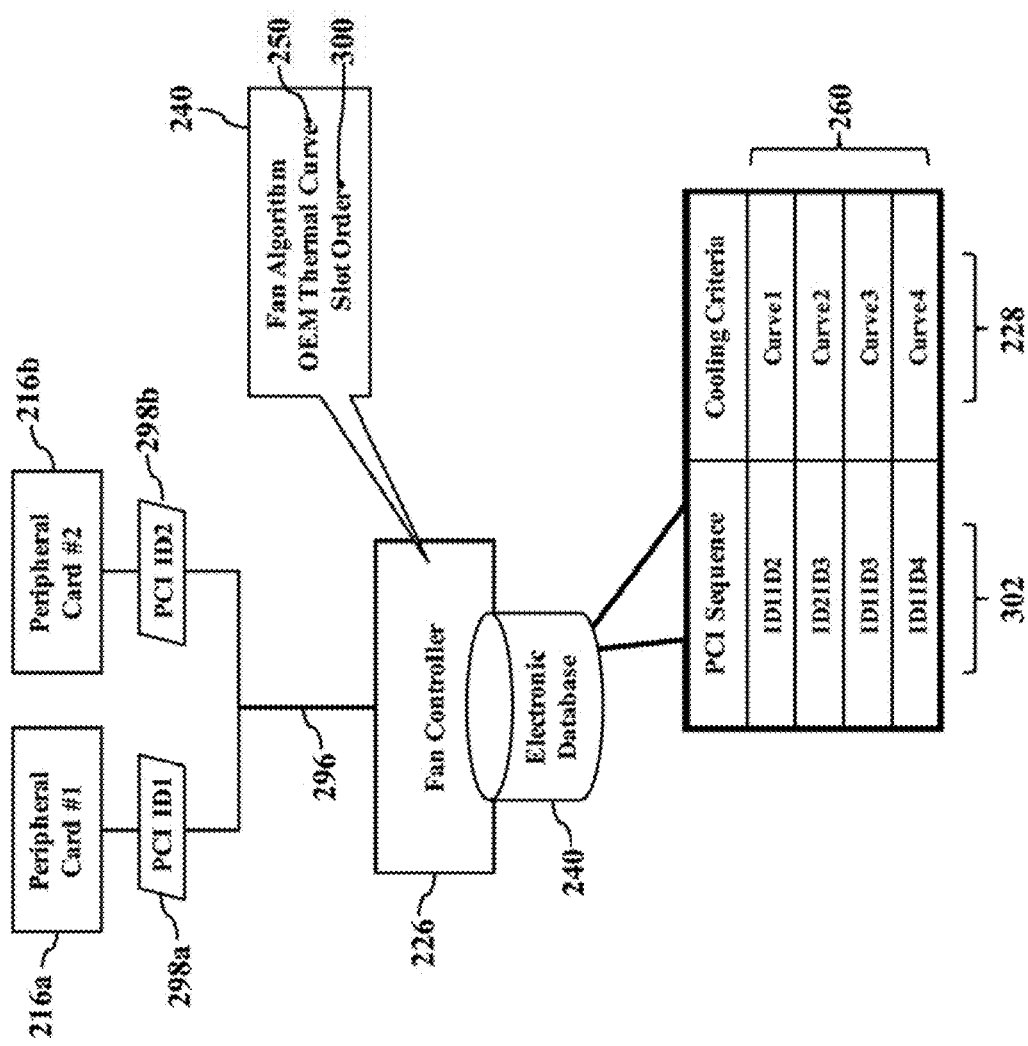

FIGS. 14-16 further illustrate automatic fan control, according to exemplary embodiments. Here exemplary embodiments may select any of the optional thermal curves 260, based on the peripheral card(s) 216 installed in the chassis 202 (illustrated in FIGS. 2 & 3). Recall that the first fan 208a may be independently controlled to cool the first region 214a that houses the various peripheral cards 216. Each one of the peripheral cards 216 communicates via a bus 296 (such as a peripheral component interconnect express or "PCIe") connection with the fan controller 226 (such as the processors 102 and 104, the chipset 110, and/or the memory 120 illustrated in FIG. 1). Here, then, each one of the peripheral cards 216 may self-identify itself to the fan controller 226. Each peripheral card 216, for example, may send a PCI identifier 298 via the bus 296. The PCI identifier 298 may be a model number, a serial number, or any other alphanumeric combination that uniquely identifies the corresponding peripheral card 216. When the fan controller 226 receives the PCI identifier 298, exemplary embodiments may retrieve the corresponding cooling criteria 228.

FIG. 15 further illustrates electronic database 240. Here the electronic database 240 may have entries that relate different PCI identifiers 298 to different cooling criteria 228 (such as the optional thermal curves 260). When the fan controller 226 receives the PCI identifier 298, the fan algorithm 240 may instruct the fan controller 226 to query the electronic database 240 for the PCI identifier 298 associated with the peripheral card 216. The fan controller 226 may thus retrieve the cooling criteria 228 (such as the corresponding thermal curve 250) having an electronic association with the PCI identifier 298. The fan controller 226 may thus automatically retrieve or load the data associated with the optional thermal curve 260 that is predetermined for the third party peripheral card 216. The fan controller 226 thus operates to cool the third party peripheral card 216 in a predetermined strategy, based on the PCI identifier 298 reported or sent by the peripheral card 216.

FIG. 16 illustrates predicted control. As the reader may understand, there may be two (2) or more peripheral cards (such as 216a and 216b) installed within the first region 214 of the chassis 202 (as FIGS. 3 & 4 best illustrate). As these multiple peripheral cards 216 operate, their combined operation may generate excessive heat that overwhelms the cooling capacity defined by the OEM thermal curve 250. Here, then, the fan controller 226 may predict which one of the optional thermal curves 260 would best cool the multiple peripheral cards 216, based on a predetermined combination of the PCI identifiers 298a and 298b. That is, each one of the peripheral cards 216 sends its unique PCI identifier 298 via the bus 296. Here the fan algorithm 240 may arrange the different PCI identifiers 298a and 298b into a sequence of numbers and/or letters, according to a known structure. For example, a simple example would arrange the different PCI identifier 298 according to a PCI slot order 300. As those of ordinary skill understand, the chassis 202 generally has individual slots into which the peripheral cards 216 individually insert. Exemplary embodiments may start with the PCI identifier 298 that corresponds to a first slot and append the PCI identifier 298 that corresponds to a second slot. Exemplary embodiments may thus continue appending additional PCI identifier 298 in the numerical PCI slot order 300 to generate a final PCI sequence 302. The fan controller 226 may then query the electronic database 240 for the final PCI sequence 302. Here, then, the electronic database 240 may have entries that are preconfigured or predetermined for different combinations of peripheral cards 216, based on their individual PCI identifier 298. The fan controller 226 may thus retrieve the cooling criteria 228 (such as the corresponding optional thermal curve 260) that has been preconfigured or predetermined to best cool the multiple peripheral cards 216 currently installed and operating within the chassis 200.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method, comprising:
receiving, by a hardware processor, an identifier of a peripheral card sent via a bus from the peripheral card, the peripheral card operating within a chassis of an information handling system;
receiving a temperature associated with a region of a chassis of the information handling system;
querying an electronic database for the identifier and a regional identifier associated with the region, the electronic database electronically associating cooling criteria and identifiers of peripheral cards including the identifier sent via the bus from the peripheral card, and the electronic database electronically associating the regional identifier with the region of the chassis;
retrieving the cooling criteria from the electronic database that is electronically associated with the identifier sent via the bus from the peripheral card;
receiving a user selected optional thermal curve from a menu of optional thermal curves for controlling a fan dedicated to the peripheral card, the user selected optional thermal curve specifying greater values than initial values of the cooling criteria specified by a manufacturer of the information handling system; and
supplying electrical power to the fan according to the cooling criteria retrieved from the electronic database, the electrical power causing the fan to spin and to cool the peripheral card.

2. The method of claim 1, further comprising retrieving a data from the electronic database that is electronically associated with the identifier sent via the bus from the peripheral card.

3. The method of claim 1, further comprising retrieving a fan voltage from the electronic database that is electronically associated with the identifier sent via the bus from the peripheral card.

4. The method of claim 1, further comprising determining a temperature associated with the peripheral card.

5. The method of claim 1, further comprising receiving a signal generated by a temperature sensor, the signal representing a temperature associated with the peripheral card.

6. The method of claim 1, further comprising retrieving a fan speed from the electronic database that is electronically associated with the identifier sent via the bus from the peripheral card.

7. An information handling system, comprising:
a hardware processor; and
a memory accessible to the hardware processor, the memory storing instructions that when executed cause the hardware processor to perform operations including:
receiving an identifier of a peripheral card sent via a bus from the peripheral card, the peripheral card operating within a chassis of an information handling system;
receiving a temperature associated with a region of a chassis of the information handling system;
querying an electronic database for the identifier and a regional identifier associated with the region, the electronic database electronically associating cooling criteria and identifiers of peripheral cards including the identifier sent via the bus from the peripheral card, and the electronic database electronically associating the regional identifier with the region of the chassis;
retrieving the cooling criteria from the electronic database that is electronically associated with the identifier sent via the bus from the peripheral card;
receiving a user selected optional thermal curve from a menu of optional thermal curves for controlling a fan dedicated to the peripheral card, the user selected optional thermal curve specifying greater values than initial values of the cooling criteria specified by a manufacturer of the information handling system; and
supplying an electrical power to the fan according to the cooling criteria retrieved from the electronic database, the electrical power causing the fan to spin and to cool the peripheral card.

8. The information handling system of claim 7, wherein the operations further comprise retrieving a data from the electronic database that is electronically associated with the identifier sent via the bus from the peripheral card.

9. The information handling system of claim 7, wherein the operations further comprise retrieving a fan voltage from the electronic database that is electronically associated with the identifier sent via the bus from the peripheral card.

10. The information handling system of claim 7, wherein the operations further comprise determining a temperature associated with the peripheral card.

11. The information handling system of claim 7, wherein the operations further comprise receiving a signal generated by a temperature sensor, the signal representing a temperature associated with the peripheral card.

12. The information handling system of claim 7, wherein the operations further comprise retrieving a fan speed from the electronic database that is electronically associated with the identifier sent via the bus from the peripheral card.

13. A memory device storing instructions that when executed cause a hardware processor to perform operations, the operations comprising:
receiving, by a hardware processor, an identifier of a peripheral card sent via a bus from the peripheral card, the peripheral card operating within a chassis of an information handling system;
receiving a temperature associated with a region of a chassis of the information handling system;
querying an electronic database for the identifier and a regional identifier associated with the region, the electronic database electronically associating cooling criteria and identifiers of peripheral cards including the identifier sent via the bus from the peripheral card, and the electronic database electronically associating the regional identifier with the region of the chassis;
retrieving the cooling criteria from the electronic database that is electronically associated with the identifier sent via the bus from the peripheral card;
receiving a user selected optional thermal curve from a menu of optional thermal curves for controlling a fan dedicated to the peripheral card, the user selected optional thermal curve specifying greater values than initial values of the cooling criteria specified by a manufacturer of the information handling system; and
supplying an electrical power to the fan according to the cooling criteria retrieved from the electronic database, the electrical power causing the fan to spin and to cool the peripheral card.

14. The memory device of claim 13, wherein the operations further comprise retrieving a data from the electronic database that is electronically associated with the identifier sent via the bus from the peripheral card.

15. The memory device of claim 13, wherein the operations further comprise retrieving a fan voltage from the electronic database that is electronically associated with the identifier sent via the bus from the peripheral card.

16. The memory device of claim 13, wherein the operations further comprise determining a temperature associated with the peripheral card.

17. The memory device of claim 13, wherein the operations further comprise receiving a signal generated by a temperature sensor, the signal representing a temperature associated with the peripheral card.

* * * * *